United States Patent
Bailey et al.

(10) Patent No.: US 10,625,205 B2
(45) Date of Patent: Apr. 21, 2020

(54) APPARATUS FOR EVACUATING A CORROSIVE EFFLUENT GAS STREAM FROM A PROCESSING CHAMBER

(71) Applicant: Edwards Limited, Burgess Hill, West Sussex (GB)

(72) Inventors: Christopher Mark Bailey, Burgess Hill (GB); Clive Marcus Lloyd Tunna, Bolney (GB); Jack Raymond Tattersall, Victoria (AU); Ingo Stephen Graham, Burgess Hill (GB); Michael Roger Czerniak, Clevedon (GB); Gary Peter Knight, Clevedon (GB); Darren Mennie, Portishead (GB); Duncan Michael Price, Clevedon (GB); Derek Martin Baker, Clevedon (GB); Andrew James Seeley, Clevedon (GB)

(73) Assignee: Edwards Limited, Burgess Hill, West Sussex (GB)

( * ) Notice: Subject to any disclaimer, the term of this patent is extended or adjusted under 35 U.S.C. 154(b) by 0 days.

(21) Appl. No.: 15/746,266

(22) PCT Filed: Jun. 15, 2016

(86) PCT No.: PCT/GB2016/051764
§ 371 (c)(1),
(2) Date: Jan. 19, 2018

(87) PCT Pub. No.: WO2017/013383
PCT Pub. Date: Jan. 26, 2017

(65) Prior Publication Data
US 2018/0207581 A1   Jul. 26, 2018

(30) Foreign Application Priority Data
Jul. 22, 2015   (GB) .................................. 1512902.6

(51) Int. Cl.
*B01D 53/75* (2006.01)
*B01D 53/78* (2006.01)
(Continued)

(52) U.S. Cl.
CPC ................ *B01D 53/75* (2013.01); *A62C 4/00* (2013.01); *B01D 53/68* (2013.01); *B01D 53/78* (2013.01);
(Continued)

(58) Field of Classification Search
None
See application file for complete search history.

(56) References Cited

U.S. PATENT DOCUMENTS 3,108,738 A   10/1963   Luhmann
3,588,283 A *   6/1971   Fitch ..................... F04C 19/00
                                                          417/68
(Continued)

FOREIGN PATENT DOCUMENTS

CN   101155634 A   4/2008
CN   201678617 U   12/2010
(Continued)

OTHER PUBLICATIONS

British Search Report dated Jan. 28, 206 and Examination Report dated Jan. 29, 2016 for corresponding British Application No. GB1512902.6.
(Continued)

*Primary Examiner* — Walter D. Griffin
*Assistant Examiner* — Jelitza M Perez
(74) *Attorney, Agent, or Firm* — Westman, Champlin & Koehler, P.A.; Theodore M. Magee

(57) ABSTRACT

Dry pumps are used to pump a variety of gas mixtures from the semiconductor industry. The present invention provides a liquid ring pump located between the dry pump and an
(Continued)

abatement device to remove soluble corrosive materials prior to the exhaust gases entry to the abatement device, the work fluid exhausted from the liquid ring pump being separated from the gas prior to entry to the abatement device.

34 Claims, 14 Drawing Sheets

(51) Int. Cl.

| | | |
|---|---|---|
| *B01D 53/68* | (2006.01) | |
| *C23C 16/44* | (2006.01) | |
| *F04C 19/00* | (2006.01) | |
| *A62C 4/00* | (2006.01) | |
| *C23C 16/24* | (2006.01) | |
| *F04C 23/00* | (2006.01) | |
| *F04C 29/00* | (2006.01) | |
| *F23G 7/06* | (2006.01) | |
| *H01J 37/32* | (2006.01) | |

(52) U.S. Cl.
CPC .......... *C23C 16/24* (2013.01); *C23C 16/4405* (2013.01); *C23C 16/4408* (2013.01); *C23C 16/4412* (2013.01); *F04C 19/001* (2013.01); *F04C 19/005* (2013.01); *F04C 23/006* (2013.01); *F04C 29/0092* (2013.01); *F23G 7/06* (2013.01); *H01J 37/32807* (2013.01); *H01J 37/32862* (2013.01); *B01D 2252/103* (2013.01); *B01D 2257/204* (2013.01); *B01D 2257/206* (2013.01); *B01D 2258/0216* (2013.01); *H01J 2237/335* (2013.01); *Y02C 20/30* (2013.01)

(56) References Cited

U.S. PATENT DOCUMENTS

| | | | |
|---|---|---|---|
| 3,846,046 A | 11/1974 | Roe et al. | |
| 4,050,851 A | 9/1977 | Haavik | |
| 6,347,926 B1 | 2/2002 | Phrhonen | |
| 9,689,387 B2 | 6/2017 | Shenoi et al. | |
| 2001/0026759 A1 | 10/2001 | Kraner | |
| 2009/0202411 A1* | 8/2009 | Smith | B01D 53/46 423/240 R |
| 2010/0024654 A1* | 2/2010 | Shaw | C23C 16/4412 96/235 |
| 2010/0101414 A1* | 4/2010 | Smith | B01D 53/68 95/156 |
| 2015/0136027 A1* | 5/2015 | Hara | C23C 16/16 118/725 |
| 2018/0209420 A1 | 7/2018 | Knight | |

FOREIGN PATENT DOCUMENTS

| | | |
|---|---|---|
| CN | 104074775 A | 10/2014 |
| DE | 2912938 A1 | 10/1980 |
| DE | 3513348 A1 | 10/1986 |
| DE | 29619930 U1 | 4/1998 |
| JP | S5879687 A | 5/1983 |
| WO | 2006008521 A1 | 1/2006 |
| WO | 2017013380 A1 | 1/2017 |

OTHER PUBLICATIONS

PCT Search Report and Written Opinion dated Sep. 9, 2016 for corresponding PCT Application No. PCT/GB2016/051764.

British Search Report dated Jan. 27, 2016 and Examination Report dated Jan. 28, 2016 for corresponding British Application Serial No. GB1512897.8.

PCT International Search Report and Written Opinion dated Oct. 6, 2016 for corresponding PCT Application Serial No. PCT/GB2016/051761.

Communication dated Oct. 29, 2018 for corresponding European Application Serial No. 16731259.4-1004.

First Office Action dated Nov. 2, 2018 for corresponding Chinese Application Serial No. 201680042944.2.

Notice of Allowance dated Jan. 24, 2020 for corresponding U.S. Appl. No. 15/745,619.

* cited by examiner

APPARATUS FOR EVACUATING A CORROSIVE EFFLUENT GAS STREAM FROM A PROCESSING CHAMBER

CROSS-REFERENCE OF RELATED APPLICATION

This application is a Section 371 National Stage Application of International Application No. PCT/GB2016/051764, filed Jun. 15, 2016, which is incorporated by reference in its entirety and published as WO 2017/013383 A1 on Jan. 26, 2017 and which claims priority of British Application No. 1512902.6, filed Jul. 22, 2015.

FIELD

Embodiments relate to apparatus for evacuating a corrosive effluent gas stream from a processing chamber comprising a vacuum pumping arrangement and abatement system.

BACKGROUND

A prior art processing system 100 is shown in FIG. 13 for processing objects in a processing chamber 102 using processing gases, and for drawing effluent waste gases from the processing chamber with a pumping apparatus 104. The process chamber 102 is provided with at least one inlet 106 for receiving one or more process gases from gas sources indicated generally at 108 in FIG. 13. During the processing conducted within the chamber 102, only a portion of the process gases supplied to the chamber will be consumed, and so the waste gas stream exhausted from the outlet 110 of the process chamber 102 will contain a mixture of the unused process gases supplied to the chamber 102, and by-products from the process conducted within the chamber 102.

The pumping system 104 comprises at least one dry pump 112 (a single pump is shown in FIG. 13, although any suitable number may be provided depending on the requirements of the processes carried out in the chamber 100). Each pump (or pumping stage) 112 is a dry pump to ensure that lubricant does not migrate upstream of the pump and contaminate the processing chamber. Also, in general, a dry pump does not provide a substantial source of moisture with which the effluent gases may react and form corrosive products to damage the pump. The dry pump 112 may comprise a multi-stage dry pump, wherein each pumping stage may be provided by a Roots-type or Northey-type pumping mechanism, a turbomolecular pump, and/or a molecular drag mechanism, depending on the pumping requirements of the process chamber 102.

Depending on the deposition step or cleaning step conducted within the process chamber 102, the waste gas stream exhausted from the dry pump may contain one or more silicon-containing or halogen-containing gases which are used as precursors in the manufacture of semiconductor devices. Examples of such gases include hydrogen fluoride, carbon tetrachloride, nitrogen trifluoride, silane, disilane, dichlorosilane, trichlorosilane, tetraethylorthosilicate (TEOS), a siloxane (such as octamethylcyclotetrasiloxane, OMCTS) and the organosilanes. Wane, for example, is typically used as a process gas in the deposition of polysilicon or silicon dioxide layers in a chemical vapour deposition (CVD) process. The gases containing fluorine or chlorine are often used for process chamber cleaning steps.

In a conventional apparatus, effluent gases are conveyed from the dry pump 112 to an abatement arrangement 114 which may contain a combustor and/or a wet scrubber. A combustor may comprise a plasma torch or another flame based device, such as an inwardly fired foraminous burner, which decompose some of the gases in the effluent gas stream. A wet scrubber may comprise a water tower or liquid ring pump through which the effluent gas stream is passed. A component of the effluent gas stream may react with or be soluble in water. Treated gas 116 is exhausted from the abatement apparatus 114.

There are many problems associated with the above described prior art system, some of which are described below.

The reaction kinetics of fluorine with water are dependent upon the temperature, pH, chemical composition of the scrubbing liquid. The reaction products are also affected by these factors. At low temperatures and high pH values significant quantities of $OF_2$ can be generated. This is highly undesirable as $OF_2$ is more toxic than fluorine. To achieve high efficiency of Fluorine scrubbing at lower temperatures without significant $OF_2$ formation the scrubbing liquid must be dosed with a chemical, such as a thiosulphate, and this adds to the cost and complexity of the scrubbing system.

In some processes used in the manufacture of semiconductors, solar panels and flat-panel displays the exhaust gases contain entrained powder and highly reactive gases which may cause blockages in abatement arrangements.

A semiconductor process dry pump must also be designed to cope with and/or eliminate the accumulation of particulate within the pump. The area most prone to this problem is the exhaust or LV end of the pump, where the pressure is highest and clearances are tightest. Failure to deal with these issues can result in seizure, for example: entrapment of condensable materials in tight axial clearances, entrapment of process particulate in tight axial clearances following dust ingestion, particulate accumulation between close running clearances, and inability to restart because of thermal contraction of the pump stator onto the rotors as the pump cools down.

Current methods used to overcome these issues, include maximising motor starting torque, introducing dust handling features and running at elevated or optimised pump exhaust temperatures to suppress process gas condensation. However, as the new generation of inverter driven pumps run faster, with lower starting torques and with tighter clearances, and as processes steps use more precursor gases, these measures are proving to be less effective.

All dry vacuum pumps are potential ignition sources. Whilst there is no deliberately intended metal-metal contact in the pumping chambers it is possible for the rotor tinting to slip and allow contact. Furthermore, the process by-products which do not pass through the pump can collect or condense, causing contact and hence hot-spots within the pump. An extreme case is when the pump is caused to seize which is a common but random occurrence. There is an increasing requirement within the semiconductor sector for a pump that can pump flammable mixtures.

Typically in vacuum system the upstream foreline connecting the dry pump to the process tool is protected against flame transmission back towards the chamber by maintaining a low pressure (normally less than 60 mbar—but it will depend on the specific process gases). However, there remain concerns around flame transmission into and along the pump exhaust line.

Although the additional of purge gas to dilute any flammable fluids can be effective in reducing or eliminating combustion, high purge gas flows are not popular in the semiconductor industry because of the cost of the gas and the impact on downstream treatment. Exhaust gas abatement is commonly achieved by combustion of the effluent. However, combustion is more difficult to achieve if the gas stream has been heavily diluted to make it non-flammable.

Combustion type abatement systems are also a potential source of ignition of the upstream flammable mixture—the ignition source is constantly present but a flame would have to travel back against the flow.

When stopping a liquid ring pump the vacuum generated in the foreline upstream of the pump must be decreased to prevent service liquid (generally water) from being drawn into the foreline. For many pump applications in the semiconductor and related industries such as flat panel display and solar panel manufacture pump forelines are kept clean and dry due to the reactive nature of the gases being pumped. One known way in which this can be achieved is by the use of a valve in the foreline which can open the foreline to atmosphere. This arrangement, however, risks potential contamination of the foreline with atmospheric moisture and hazardous process gases escaping to atmosphere. Alternatively, clean dry purge gas (such as nitrogen) can be injected into the foreline to relieve the vacuum, however, the volume of nitrogen required can be substantial, thus further increasing the cost of the system.

The discussion above is merely provided for general background information and is not intended to be used as an aid in determining the scope of the claimed subject matter. The claimed subject matter is not limited to implementations that solve any or all disadvantages noted in the background.

SUMMARY

Embodiments as described in more detail below seek to at least mitigate one or more of the problems associated with the prior art.

An apparatus for evacuating a gas stream comprising a corrosive fluid exhausted from a processing chamber, comprising: a dry pumping arrangement for evacuating the gas stream comprising a corrosive fluid from the processing chamber; a liquid ring pump arranged for evacuating the gas stream comprising a corrosive fluid from the dry pump and at least partially reducing the corrosive fluid content of the gas stream by dissolving said corrosive fluid into the service liquid of the liquid ring pump; a separator for separating, from the service liquid and remaining gas stream mixture exhausted from the liquid ring pump, the remaining gas stream; and an abatement arrangement for treating the separated remaining gas stream exhausted from the separator.

Other preferred and/or optional aspects of the invention are defined in the accompanying claims.

The Summary is provided to introduce a selection of concepts in a simplified form that are further described in the Detail Description. This summary is not intended to identify key features or essential features of the claimed subject matter, nor is it intended to be used as an aid in determining the scope of the claimed subject matter.

BRIEF DESCRIPTION OF THE DRAWINGS

In order that the embodiments may be well understood, several embodiments thereof, which are given by way of example only, will now be described with reference to the accompanying drawings, in which.

DETAILED DESCRIPTION

Figure 1:
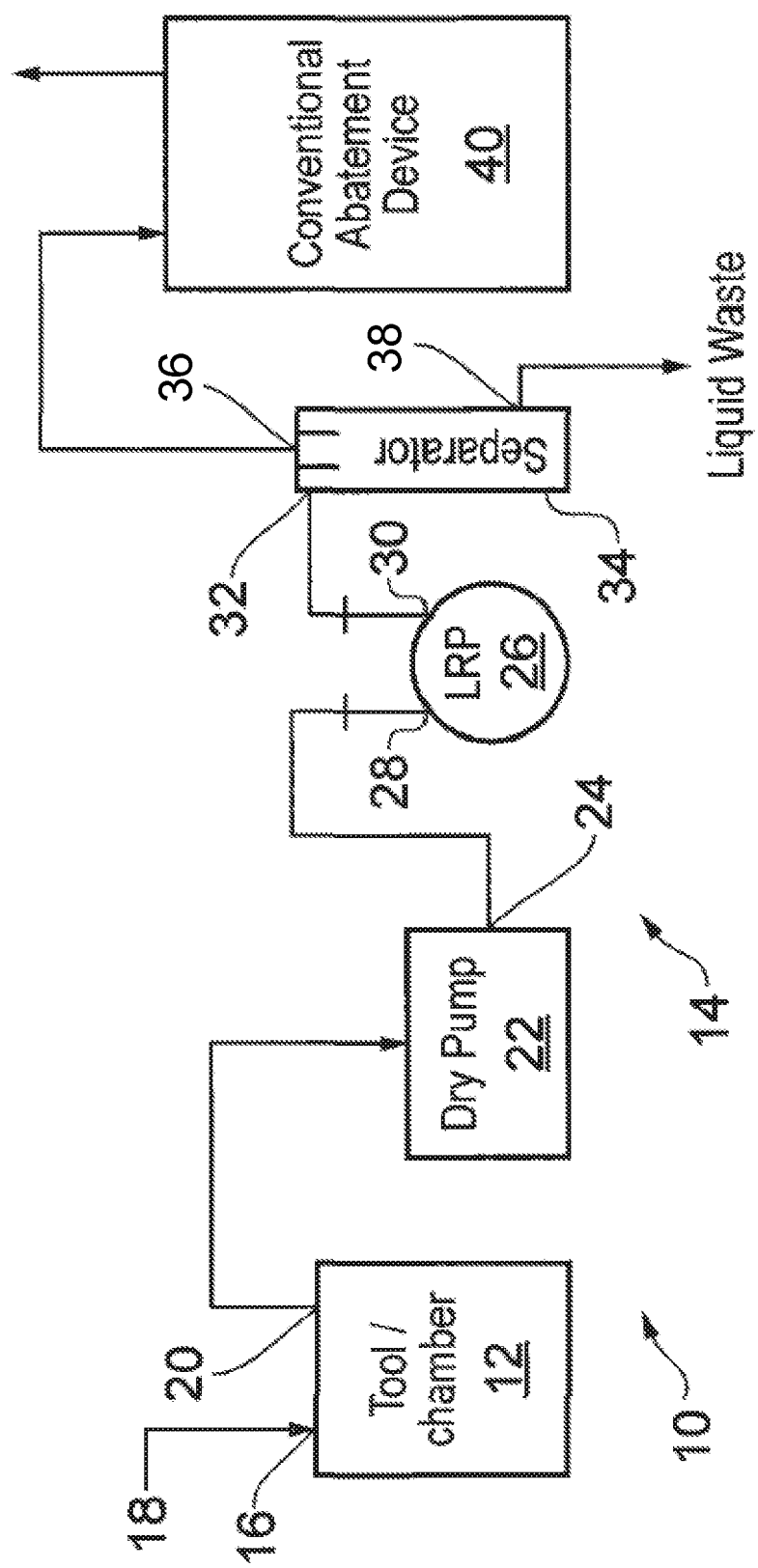
FIG. 1 illustrates schematically a system for evacuating a process chamber.

Referring to FIG. 1, there is shown a system 10 for processing objects in a processing chamber 12 using processing gases, and a pumping apparatus 14 for drawing effluent gas streams exhausted from the processing chamber. The process chamber 12 is provided with at least one inlet 16 for receiving one or more process gases from gas sources indicated generally at 18 in FIG. 1. The process chamber 12 may be a chamber within which the processing of semiconductors or flat panel display devices takes place.

During the processing conducted within the chamber 12, only a portion of the process gases supplied to the chamber will be consumed, and so the waste gas stream exhausted from the outlet 20 of the process chamber 12 will contain a mixture of the process gases supplied to the chamber 12, and by-products from the process conducted within the chamber 12.

The pumping system 14 comprises at least one dry pump 22 (one is shown in FIG. 1, although any suitable number, and combination, of dry pumps may be provided depending on the requirements of the processes carried out in chamber 10). Each pump or pumping stage 22 is dry to ensure that lubricant does not migrate to, and contaminate, the processing chamber. The dry pump 22 may comprise a multi-stage dry pumping system, wherein each pumping stage may be provided by at least one of a Roots-type or Northey-type pumping mechanism, a turbomolecular pump, and/or a molecular drag mechanism, depending on the pumping requirements of the processes carried out in the chamber 12.

In the present arrangement, the pump(s) 22, for example multi-stage dry pumps, are arranged to draw the waste gas stream from the process chamber 12 and exhaust the gas stream from an exhaust 24 thereof to a liquid ring pump 26. With this arrangement the dry pump 22 exhausts the effluent gas stream at a sub-atmospheric pressure, typically in the range from 50 to 500 mbar. Accordingly, the power requirement of the dry pump 22 is reduced, compared to normal usage, since it is not required to exhaust the gas stream at atmospheric pressure. The low vacuum stage of a dry pump typically consumes the greater power as compared with the higher vacuum stages; the pumping apparatus 14 therefore includes a liquid ring pump 26 having a first inlet 28 connected to the exhaust 24 of the dry pump(s) 22 for conveying the waste stream to the liquid ring pump 26. Whilst on an initial inspection it may be considered that the addition of a further pump (the liquid ring pump 26) would negate any power reduction advantages associated with the dry pump 22 exhausting at sub-atmosphere, in the present arrangement, the liquid ring pump provides a number of further advantages.

In the present arrangement, the backing pump is a liquid ring pump which is interposed between the conventional dry pump(s) 22 and abatement arrangement. The liquid ring pump 26 pre-conditions the effluent gas stream prior to entry into the abatement apparatus and also provides compression of the gas stream to atmospheric pressure.

However, unlike dry pumps which do not contain any significant amounts of moisture, a liquid ring pump contains a service liquid, typically water, for forming a liquid ring, in use, which interacts with the effluent gas. Accordingly, the liquid ring pump is constructed of one or materials which are resistant to corrosion products produced by the reaction or solubility of effluent gases in the service liquid of the pump. For example, if the effluent gas contains fluorine and the service liquid is water, the corrosion products comprise hydrofluoric acid. A suitable liquid ring pump is shown in the applicant's co-pending application No. GB1512897.8.

As indicated above, the liquid ring pump provides a preconditioning step to improve the reliability and performance of the abatement apparatus. In this regard, the pump removes significant amounts of powder and other particulates from the gas stream reducing the blocking frequency of the abatement arrangement. Additionally, the effluent gases may react with, or be soluble in, the service liquid of the liquid ring pump thereby reducing the load on the abatement arrangement. It is also to be noted that the liquid ring pump can be placed downstream of dry pump 22 without significant increase in power requirements.

Depending on the deposition step or cleaning step conducted within the process chamber 10, the waste stream entering the liquid ring pump 26 may contain one or more silicon-containing or halogen-containing gases which are used as a precursor in the manufacture of a semiconductor device. Examples of such gases include hydrogen fluoride, carbon tetrachloride, trifluoromethane, silane, disilane, dichlorosilane, trichlorosilane, tetraethylorthosilicate (TEOS), siloxanes, such as octamethylcyclotetrasiloxane (OMCTS) and organosilanes. Silane, for example, is typically used as a process gas in the deposition of polysilicon or silicon dioxide layers in a chemical vapour deposition (CVD) process. Gases containing fluorine or chlorine, used in the cleaning steps, may also be accompanied by molecular fluorine or chlorine.

The exhaust 30 of the liquid ring pump 26 is connected to an inlet 32 of a separator 34. The separator 34 separates service liquid exhausted from the liquid ring pump 26 along with the gas stream as described in more detail below. The separator comprises a drain 38 from which service liquid containing corrosive products can be drained for disposal and an exhaust 36 through which the gas stream can pass, connected to abatement arrangement 40.

The abatement apparatus 40 may contain a combustion device and/or a wet scrubber. The combustion device may comprise a flame or plasma torch to decompose undesirable constituents of the effluent gas stream. The wet scrubber may comprise a packed tower water scrubber, a device which comprises a column filled with packing material, irrigated by a scrubbing liquid, through which the effluent gas stream is passed. The effluent gas stream reacts with or is soluble in the scrubbing liquid.

Figure 2:
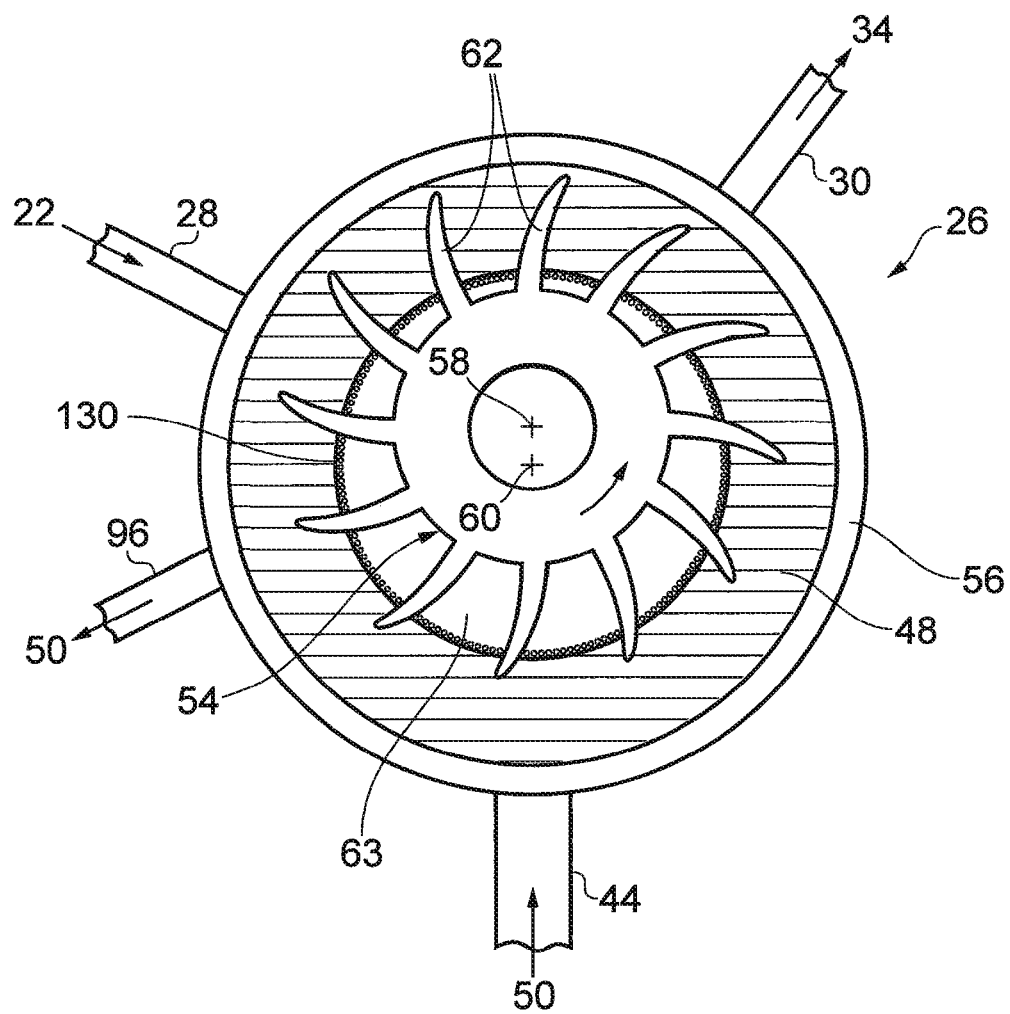
FIG. 2 illustrates a radial cross-section through a known liquid ring pump.

Referring to FIG. 2, the waste gas stream enters the liquid ring pump 26 (herein now referred to as LRP 26) through the inlet 28. A second inlet 44 conveys service liquid from a source of liquid for forming a liquid ring 48 within the LRP 26. In this embodiment the service liquid is water, although any other aqueous solution may be used provided it is reactive with, or a suitable solvent for, the effluent gases being pumped.

The liquid ring pump 26 comprises a rotor 54 rotatably mounted in an annular housing 56 such that the rotor axis 58 is eccentric to the central axis 60 of the housing 56. The rotor 54 has blades 62 that extend radially outwardly therefrom and are equally spaced around the rotor 54 (Liquid ring pumps with non-equally spaced blades are also known). On rotation of the rotor 54, the blades 62 engage the service liquid and form it into an annular ring 48 inside the housing 56.

This means that on an inlet side of the LRP 26 the gas present in the compression regions located between adjacent rotor blades 62 is moving radially outward, away from the rotor hub, while on the outlet side of the pump the gas is moving radially inward toward the rotor hub. This results in a piston-type pumping action on the gas passing through the pump.

The effluent gas stream entering the liquid ring pump 26 through the first inlet 28 is pulled into the spaces 63 between adjacent blades 62. The gas stream is compressed by the piston-type pumping action and exhausted through an exhaust 30. The gas stream exhausted from the LRP 26 predominantly comprises treated gas but also some service liquid from the liquid ring 48. The service liquid becomes contaminated with corrosion products produced by treatment of the gas stream and over time the liquid may become less effective at treating the gas or may become too corrosive. It is necessary, therefore, to periodically remove and replenish service liquid in the LRP 26. The rate at which service liquid is replenished is dependent on a number of factors, for example, the reactivity or solubility of the effluent gas stream with the service liquid and the desired temperature of the service liquid. In use, the temperature of the service liquid in the LRP 26 will increase over time and therefore the desired temperature of the service liquid can be controlled by controlling the rate at which fresh cool liquid is introduced to the pump. Liquid drained from the pump, via drain port 96, may subsequently be treated to remove corrosion products and re-used or simply disposed of.

Figure 3:
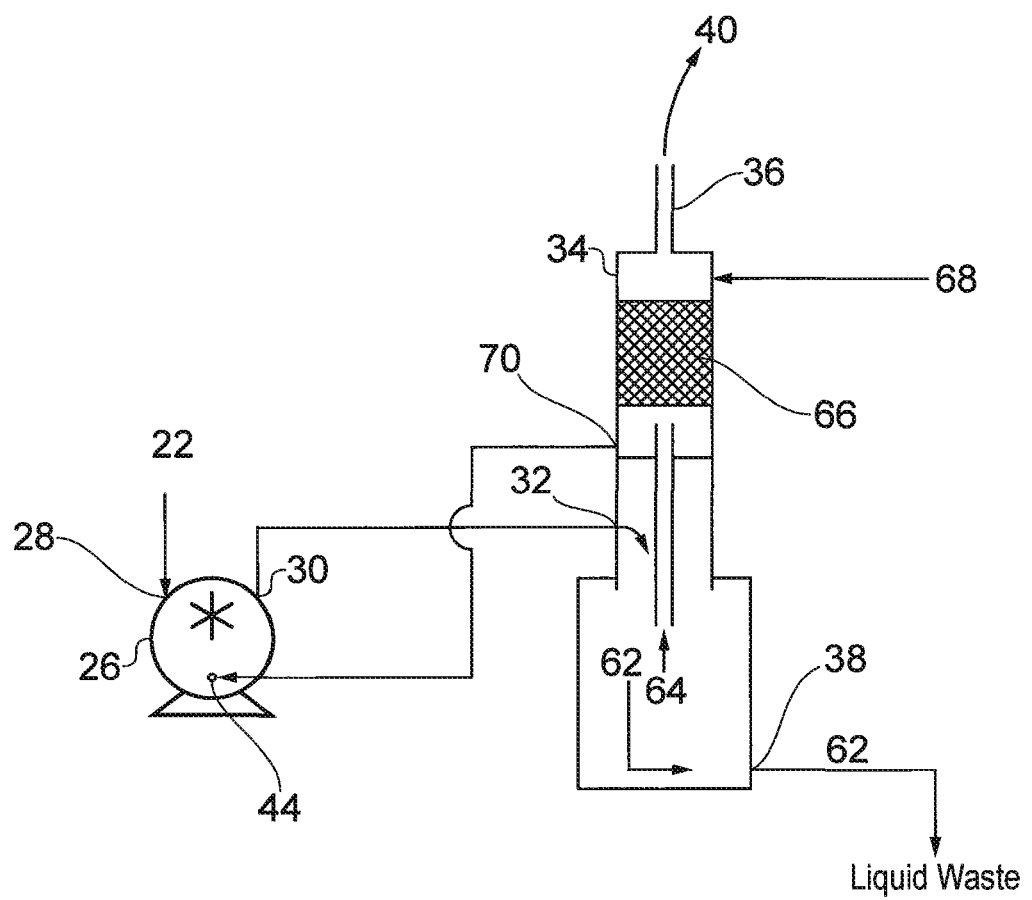
FIG. 3 illustrates schematically an apparatus for evacuating a corrosive effluent gas stream according to one embodiment.

FIG. 3 shows in more detail one arrangement of the liquid ring pump 26 of FIG. 2 and the separator 34, which can be used for example for preconditioning an effluent gas stream containing fluorine. In this example, the effluent gas stream initially enters the liquid ring pump 26 through inlet 28 where it contacts the hot service liquid in ring 48 within the LRP 26 and reacts to form hydrofluoric acid. The remaining gas stream and a portion of the service liquid, now containing hydrofluoric acid, are ejected from the pump exhaust 30 into a separator tank 34 where service liquid 62 falls to the bottom of the tank and is drained through drain 38. Gas 64 in the gas/liquid stream is conveyed upwards into a wet scrubber 66. Due to the high temperature of the service liquid the resulting hydrofluoric acid solution passing to the separator 34 has an appreciable vapour pressure which results in the separated gas stream containing an appreciable concentration of HF. The wet scrubber 66 is fed with clean process water 68 which both cools and scrubs the majority of the remaining HF from the gas stream and the relatively acid-free gas stream exits the separator 34 for conveying to the abatement apparatus 40. The concentrated acid waste 62 can be pumped from the separator to the appropriate storage or treatment stream. Following passage through the wet scrubber, the liquid 68 is conveyed through outlet 70 to the LRP 26 where it is used to generate the liquid ring 48. The use of the same liquid in the polishing liquid and then subsequently the liquid ring pump reduces water consumption and does not significantly reduce the effectiveness of the treatment of the effluent gas stream in the LRP 26. It will also be noted in this regard and as shown in FIG. 2 that a foam zone 130 is generated in the pump which is increases the surface area of the liquid available for reaction with the effluent gas stream.

Figure 4:
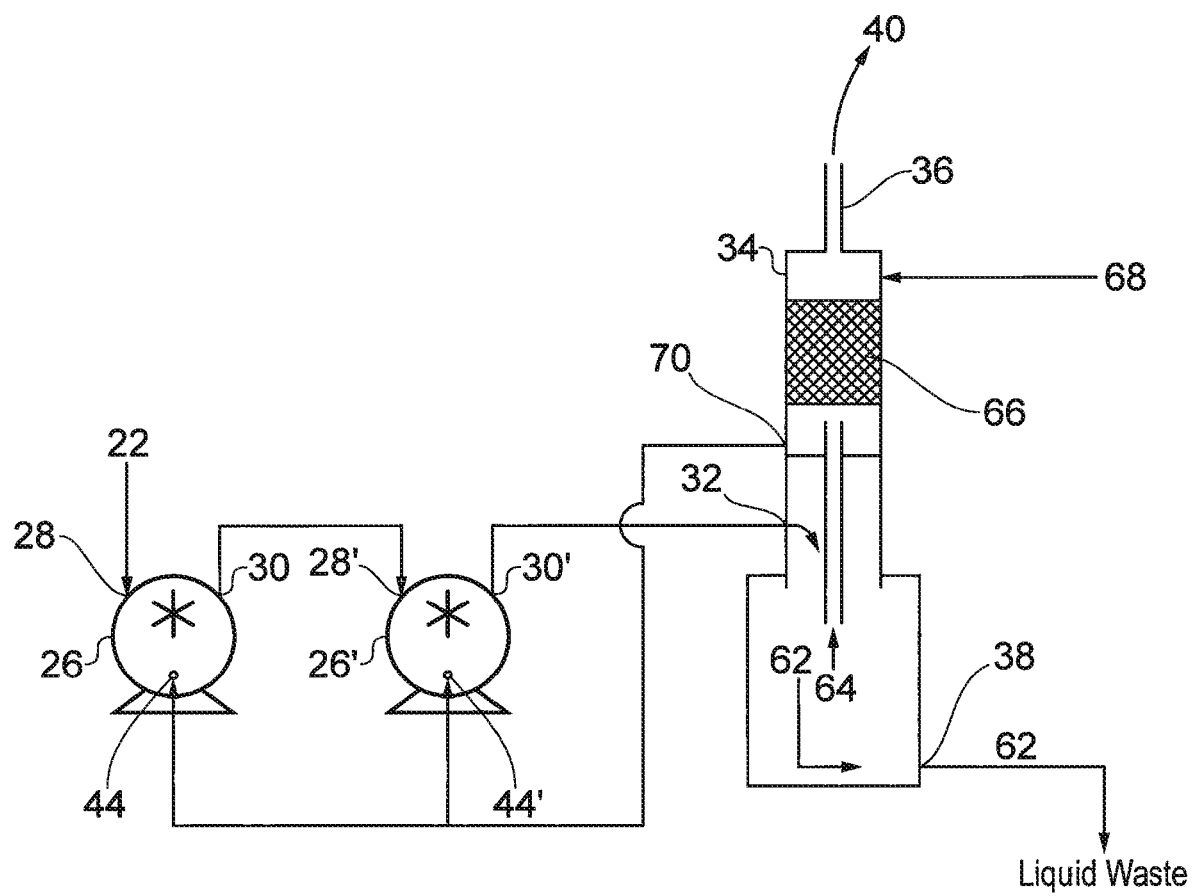
FIG. 4 illustrates schematically a further apparatus for evacuating a corrosive effluent gas stream according to one embodiment.

FIG. 4 shows a modification of the arrangement shown in FIG. 3. In FIG. 3, two liquid ring pumps 26 and 26' are connected for pumping effluent gas from the dry pump thereby increasing efficiency of the treatment of the gas stream and also optionally increasing available compression ratio. Like reference numerals are given for like features shown in FIG. 3. The effluent gas stream as shown is conveyed through inlet 28 to the first liquid ring pump 26 where it is treated by the service liquid in the pump. Gas and liquid is exhausted through outlet 30 of the first pump and conveyed to the inlet of the second liquid ring pump 26' where it treated again by the service liquid in that pump. Gas and liquid is exhausted through the outlet 30' of the second pump to the separator 34. Fresh liquid 68 is passed through the wet scrubber 66 and exhausted through outlet 70. The exhausted outlet liquid is conveyed to inlets 44, 44' of the first and the second liquid ring pumps 26, 26' for treatment of the effluent gas stream. In an alternative arrangement, fresh service liquid may be introduced through inlet 44, 44' of one or both of the liquid ring pumps 26, 26'. As shown, the two liquid ring pumps 26, 26' are arranged in series but in an alternative arrangement they may be arranged in parallel for treating the effluent gas stream from the dry pump 22.

Figure 5:
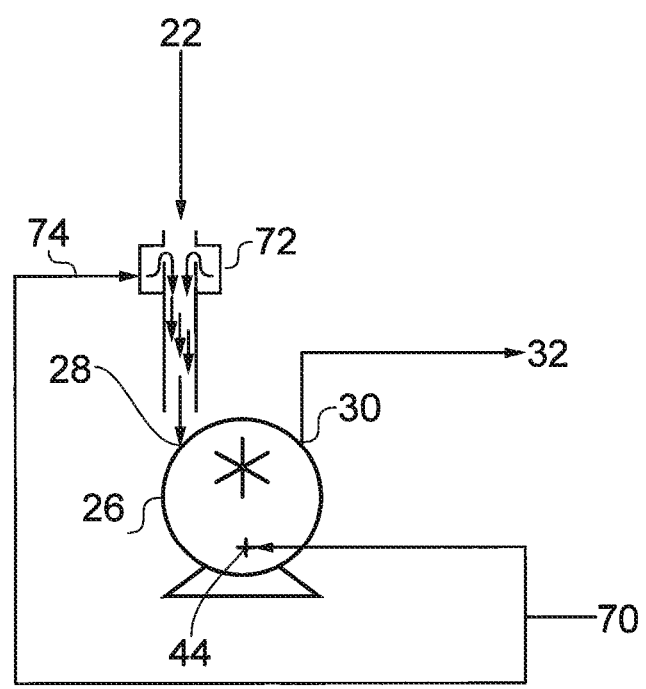
FIG. 5 illustrates a weir device according to one embodiment.

In a further refinement of either of the arrangements shown in FIG. 3 or 4, a weir section 72 in FIG. 5 is interposed between the dry pump 22 and the liquid ring pump 26 shown in FIG. 3 or the first liquid ring pump 26 shown in FIG. 4. Like reference numerals are given for like features shown in FIGS. 3 and 4. The weir section 72 is fed with hot service liquid 74 from outlet 70 of the separator 34. The falling wall, or curtain, of hot service liquid 74 on the inside of the inlet pipe provides a significantly longer contact area for the effluent gas stream to mix with the service liquid and thus improves the efficiency of the liquid ring pump scrubber. In addition, the water weir can remove particulate from the gas stream, thus prevent, or reduce the chance of, the inlet to the LRP 26 blocking.

Fluorine is a commonly used processing gas. Typically, wet scrubbing of fluorine should take place at relatively high temperatures because oxygen diflouride ($OF_2$) may be generated at relatively low wet scrubbing temperatures (for example around room temperature). Oxygen diflouride is far more toxic than fluorine. Therefore the liquid used in a wet scrubber for fluorine should be heated, preferably to more than 60° C. to promote the formation of hydrofluoric acid (HF) over $OF_2$. Previously, wet scrubbers used either high flows of water to eliminate the need to heat acidified recirculated liquid and thus produce significantly higher waste volumes (and lower concentrations of $OF_2$) or they utilise expensive chemical dosing systems.

In the present arrangement, the liquid ring pump 26 generates heat during use, due to the compression of the gas stream, thereby heating the service liquid. As the pumping efficiency of the pump is determined by the vapour pressure of the service liquid and the vapour pressure increases as the temperature of service liquid rises it is typically desirable in liquid ring pumps to feed relatively large amounts of fresh and cool service liquid into the pump so that the vapour pressure is maintained relatively low. In the present arrangement, when the liquid ring pump is used to scrub fluorine, the amount of service liquid fed into the pump is deliberately restricted to increase the temperature of the service liquid above its normal operating temperature. Although this increased temperature would appear undesirable, due to the increase in inlet pressure at the inlet, the liquid ring pump in this system is primarily used for scrubbing gas and to a lesser extent used for pumping. Accordingly, any reduction is pumping efficiency due to heating of the service liquid is outweighed by the improved scrubbing capacity of the pump. In addition, the presence of the water weir at the inlet to the LRP 26 will partially reduce the local inlet pressure.

As shown in FIG. 1 and described above, a liquid ring pump 26 exhausts to a separator 34 which separates service liquid from the remaining gas stream exiting the LRP 26. Gas is subsequently conveyed to an abatement apparatus, or arrangement, 40. As described above, the separator 34 may additionally be provided with a wet scrubbing function which continues to wet scrub gas which has been scrubbed by the liquid ring pump.

When pumping flammable gases from a process chamber, the gases may be ignited in the dry pump 22 by sparks generated by metal to metal contact, for example if the rotors become misaligned and contact each other. Due to the low pressure upstream of the dry pump 22, a flame does not tend to travel, or propagate, upstream but instead will travel downstream of the point of ignition. Whilst it may be considered that a downstream liquid ring pump would extinguish the flame, it has been found that flames may pass through and continue downstream of the liquid ring pump. Whereas, the liquid ring pumping mechanism is capable of pumping a gas stream containing a flame the separator 34, however, cannot and may ignite and cause large amounts of damage. If a separator 34 is not provided, and instead only a wet scrubber is placed downstream of the liquid ring, similar problems can exist as wet scrubbers cannot generally handle gas streams containing a flame either.

Figure 6:
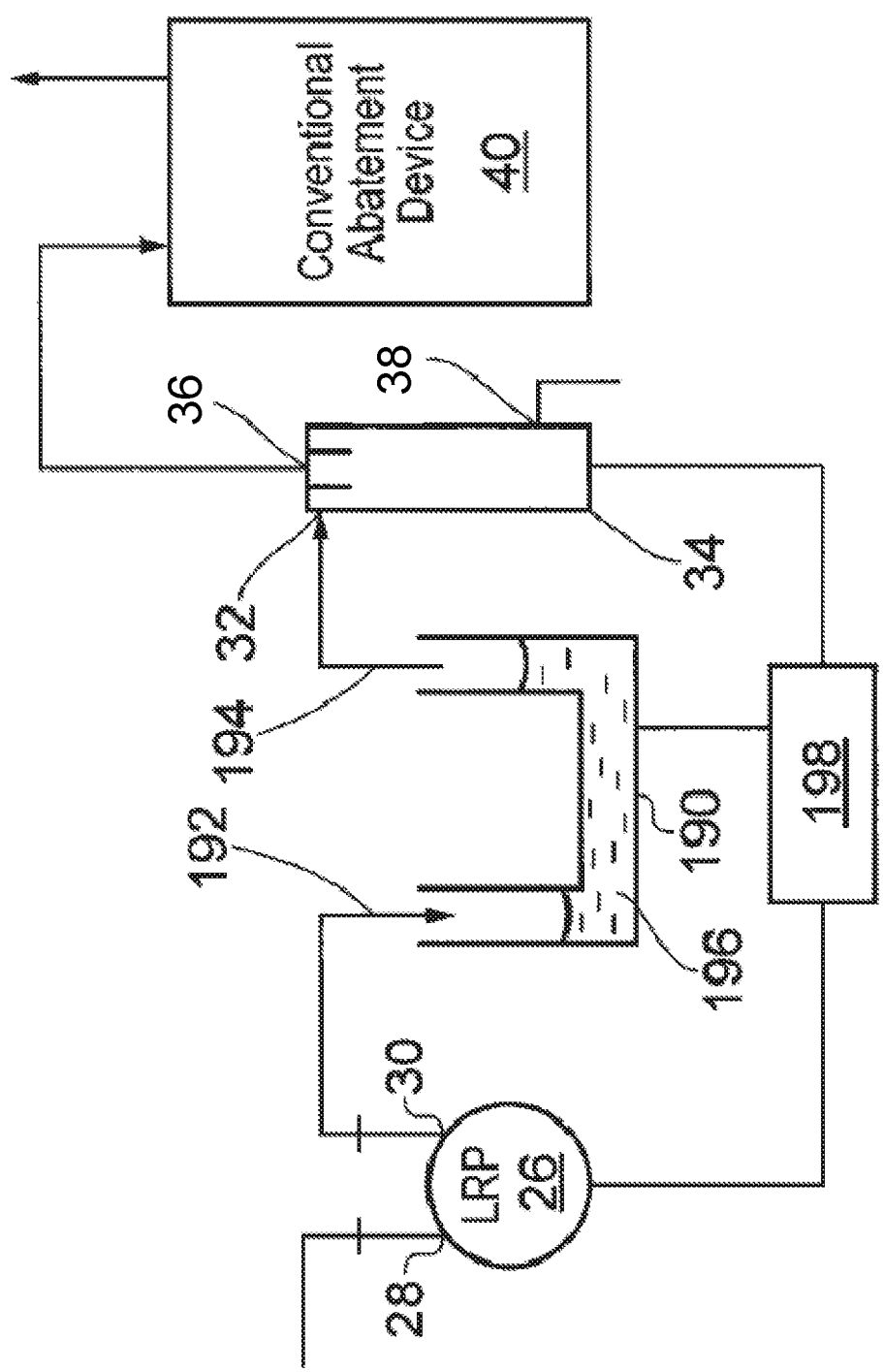
FIG. 6 illustrates schematically an apparatus for pumping a flammable effluent gas stream according to one embodiment.

As shown schematically in FIG. 6, a hydraulic flame arrester, or flame trap, 190 is provided downstream of the liquid ring pump 26 for arresting the passage of a flame. An inlet 192 of the flame arrester is connected to the outlet 30 of the liquid ring pump 26, whilst an outlet 194 of the flame arrester is connected to an inlet 32 of the separator. The flame arrester 190 as shown is formed generally of a U-shaped passage containing water 196 or other suitable liquids. The gas stream is conveyed through the inlet 192 and any flame in said gas stream is extinguished by passage through the liquid 196. Thus gas exhausted through outlet 194 is substantially free of flames. The action of the gas stream passing through the flame arrester 190 causes the illustrated difference in liquid levels between the inlet 192 and the outlet 194.

During use of the flame arrester 190 the liquid 196 will become heated by contact with the gas stream. Additionally, liquid 196 may be reactive with or dissolve constituents of the gas flow generating corrosive solutions, for example, acidic solutions. It is necessary, therefore, to manage the condition of liquid 196 to achieve optimum operational performance. In this regard, the gas path through the liquid 196 is such that the residence time (the time the gas stream is in contact with the liquid 196) is sufficient to cool the gas stream enough to extinguish any flame. It is important to extinguish any flame before it enters the main chamber of the wet scrubber to avoid igniting the gas mixture contained inside it and thus preventing potential explosions. Some of the operational parameters that need to be considered to ensure this is achieved are flame arrestor path length, residence time and the size of the bubbles of gas generated in the flame arrestor.

Figure 7:
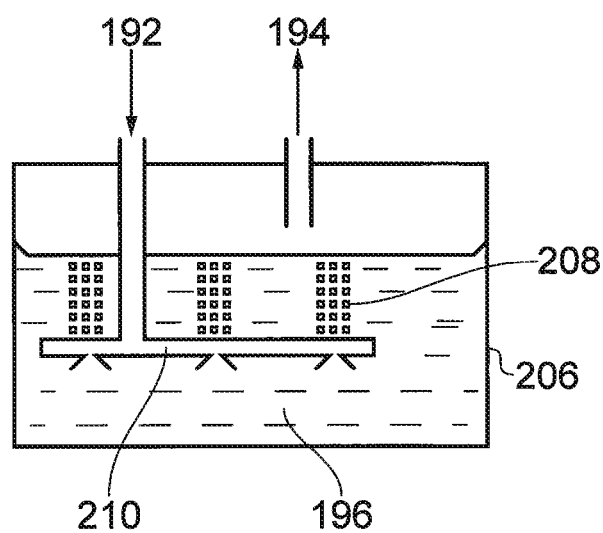
FIG. 7 illustrates a diffusor for a flame arrestor according to one embodiment.
Figure 8:
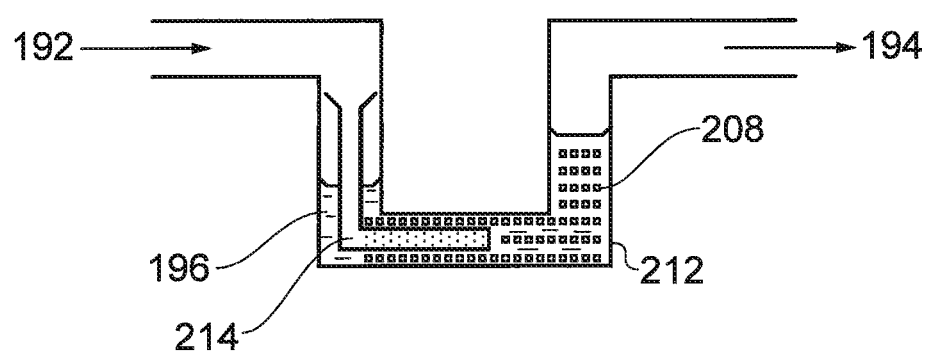
FIG. 8 illustrates a further diffusor for a flame arrestor according to one embodiment.

A diffuser may be used as shown in FIGS. 7 and 8 for controlling bubble size of gas migrating through the flame arrester. In FIG. 7, the flame arrester comprises a container 206 for liquid 196, and a diffuser 210 for generating small bubbles 208 from the gas stream entering the flame arrester through inlet 192. The small bubbles have a greater surface area to volume ratio and therefore more gas passing through the flame arrester comes into contact with liquid 196 reducing the possibility of a flame being conveyed downstream to the wet scrubber/separator.

In FIG. 8, the flame arrester 190 comprises a generally U-shaped pipe 212 for liquid 196, and a diffuser 214 for generating small bubbles 208 from the gas stream entering the flame arrester through inlet 192.

Further, the temperature of the liquid 196 should be such that the gas stream exhausted from the flame arrester is still at a sufficient temperature to achieve the operational requirements of the separator or a wet scrubber downstream of the arrester. In that case the optimum temperature will be one that is low enough to extinguish a flame and high enough to meet the solubility requirement in the separator/wet scrubber. The operating temperature range (window) will need to be determined for each precursor or process by-product targeted.

The condition of the liquid 196 in the flame arrester 190 may be controlled by a liquid controller, or liquid management system, 198 in liquid connection with the flame arrester. The liquid 196 may be re-conditioned in the liquid controller by, for example having its acidic content reduced and/or temperature controlled, and re-circulated back to the flame arrester. The liquid 196 can be exhausted to a waste disposal unit and fresh liquid supplied from a source of liquid.

The liquid controller 198 may additionally be in liquid communication with the liquid ring pump 26 and/or the separator 34 and/or a downstream wet scrubber (not shown). The liquid from each of these units may be isolated one from another, or alternatively, the liquid from one unit may be common to one or more of the other units. For example, it may be advantageous that liquid from the separator is passed first to the separator and then to the flame arrester and then to the liquid ring pump. Temperature of the liquid in each of the units may be controlled with a heat exchanger.

If the separator 34 does not contain an integrated wet scrubber, as shown more particularly in FIG. 3, the flame arrester 190 may be placed downstream of the separator since the separator can be configured (unlike a wet scrubber) to be resistant to a flame containing gas stream.

The hydraulic flame arrestor 190 may be incorporated into the apparatus as an integrated part of the liquid ring pump, an integrated part of the wet scrubber/discharge separator, an integrated part of a combined liquid ring pump and wet scrubber, or as a discrete component in the system.

There should be sufficient liquid retained in the flame arrester to perform its required functionality. The liquid volume can be expected to reduce over time due to the effects of evaporation and, potentially, the result of being blown out of the trap during chamber pump down or due to any other instances of high gas flow. Chamber pump down effects could be mitigated by switching the exhaust of the pumping system to a bypass line (not shown) allowing the gas stream to selectively bypass the flame arrester but such an arrangement may not be desirable because a flame could potentially be generated while the bypass line is selected.

The amount of liquid 196 in the flame arrester can be monitored by measurement of the mass of the pipe and mechanical or optical measurement. A predetermined level of liquid 196 can be set in the flame arrester below which the system is configured to convey additional liquid is to the arrester.

Figure 9:
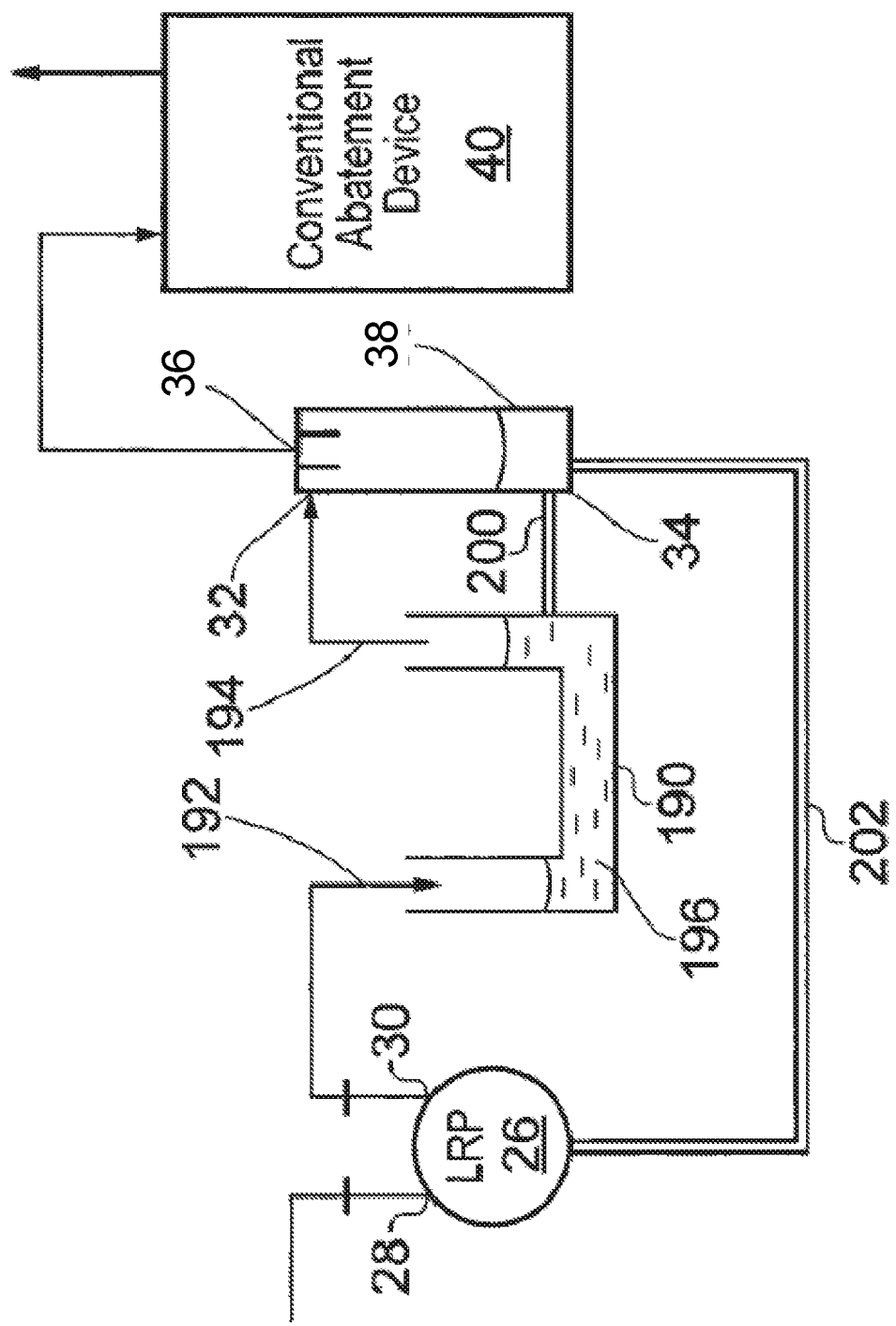
FIG. 9 illustrates schematically a further apparatus for pumping a flammable effluent gas stream according to one embodiment.

In an arrangement shown in FIG. 9, the flame arrester is connected by a balance tube 200 to the wet scrubber/separator 34. The location of the balance tube is set so that in use it is below the minimum operational level of liquid in the wet scrubber/separator. The liquid sump 204 in the separator 34 is connected the liquid ring pump 26 by a return line 202. In this way a constant bleed of liquid from the LRP 26 is circulated through the flame arrester 190, through the sump of the separator 34 and back to the LRP 26. The liquid returned to the LRP 26 is cooled and diluted in the sump of the separator 34.

Figure 10:
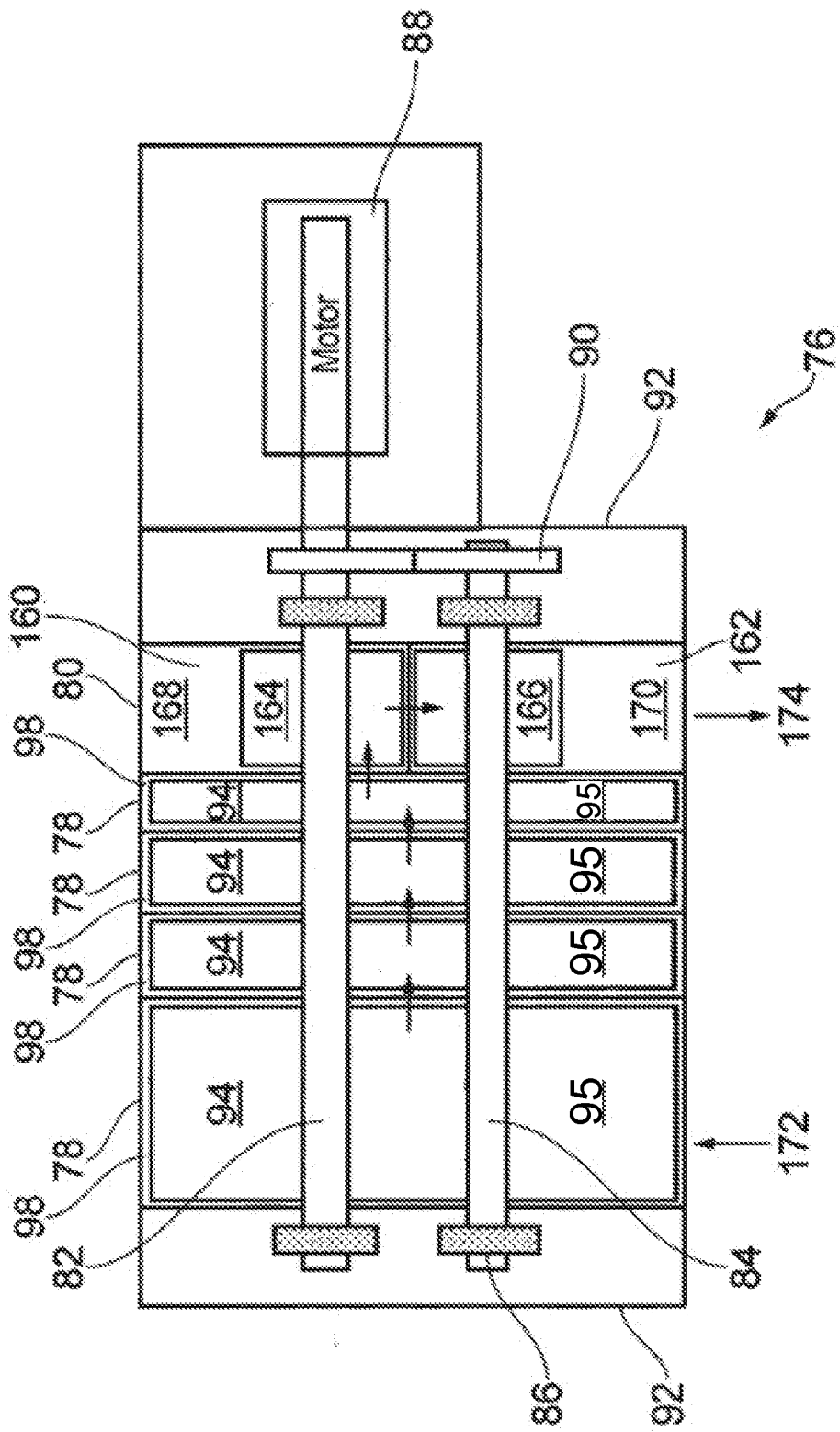
FIG. 10 illustrates a combination dry and liquid ring pump according to one embodiment.

FIG. 10 shows a pumping arrangement in accordance with another embodiment of the invention. In FIG. 10, the low vacuum, exhaust, stage of a multi-stage dry pump is replaced with a liquid ring stage. In the present illustrated arrangement, pump 76 comprises roots (and/or northey (claw)) pumping stages 78 and a liquid ring pump stage 80. The term high vacuum pumping stages in the present description is reference to stages at higher vacuum than the low vacuum liquid ring pumping stage or stages.

In the high vacuum pumping stages 78, two rotors are supported for rotation by respective drive shafts 82, 84 which are in turn supported by hearings 86 and driven by a motor 88 through a gear assembly 90. Head plates 92 are provided at each axial end of the pumping stages.

In each of the roots pumping stages, two rotors 94, 95 are supported for rotation by respective drive shafts 82, 84 and co-operate together in pumping chambers 98 for pumping gas from an inlet to an outlet of the stage. As illustrated, two liquid ring pumping stages 160, 162 are provided and may be connected in series or in parallel with each other. The liquid ring pumping stages 80 comprises rotors 164, 166 supported for rotation by respective drive shafts 82, 84. The rotors 164, 166 rotate within respective pumping stages 168, 170 for pumping gas from an inlet to an outlet of each stage. In this regard, it will be noted that drive shafts 82, 84 are common to at least one high vacuum stage and to one of the liquid ring pumping stages.

In other arrangements, a single liquid ring pumping stage may be provided downstream of the high vacuum pumping stages. Alternatively, more than one group 80 of liquid ring pumping stages may be provided in parallel or series.

In use, as indicated by arrows in FIG. 10, gas enters the pump through an inlet 172 and passes through the high vacuum stages 1 to 4. Gas subsequently enters the liquid ring stages in series passing first into liquid ring stage 160 and subsequently liquid ring stage 162. Gas is exhausted from the pump through pump outlet 174, typically at around atmospheric pressure.

The present arrangement is particularly suited for pumping gas streams having entrained particulates. In prior art pumps, it is the low vacuum stage, or stages, which are particularly prone to problems caused by collection of particulates. In the embodiments, the downstream liquid ring pumping stages 80 use a service liquid such as water as a sealing fluid, meaning that pump surfaces are flushed clean and tight radial clearances are not required. Hence large particle sizes can pass freely through the stage. This greatly enhances the ability of the pump's exhaust stage to deal with these type of contaminants.

In one example, the liquid ring pumping stage or stages exhaust to atmospheric pressure and can achieve a sustainable operative pressure of approximately 100 mbar at the inlet to liquid ring stage.

The service liquid of the liquid ring pumping stages scrubs condensate, particulates or other deposits in the gas stream. This service liquid is then re-circulated and treated/managed in order to maintain its effectiveness, which may eliminate the requirement for downstream gas stream abatement devices on certain processes.

The pressure demarcation between dry and wet mechanisms may occur at approximately 100 mbar (zero flow), which is convenient for some sub-atmospheric abatement devices. The arrangement shown in FIG. 11 shows a vacuum pump which is similar in arrangement to that shown in FIG. 10 and like features will be referred to by like reference numerals.

Figure 11:
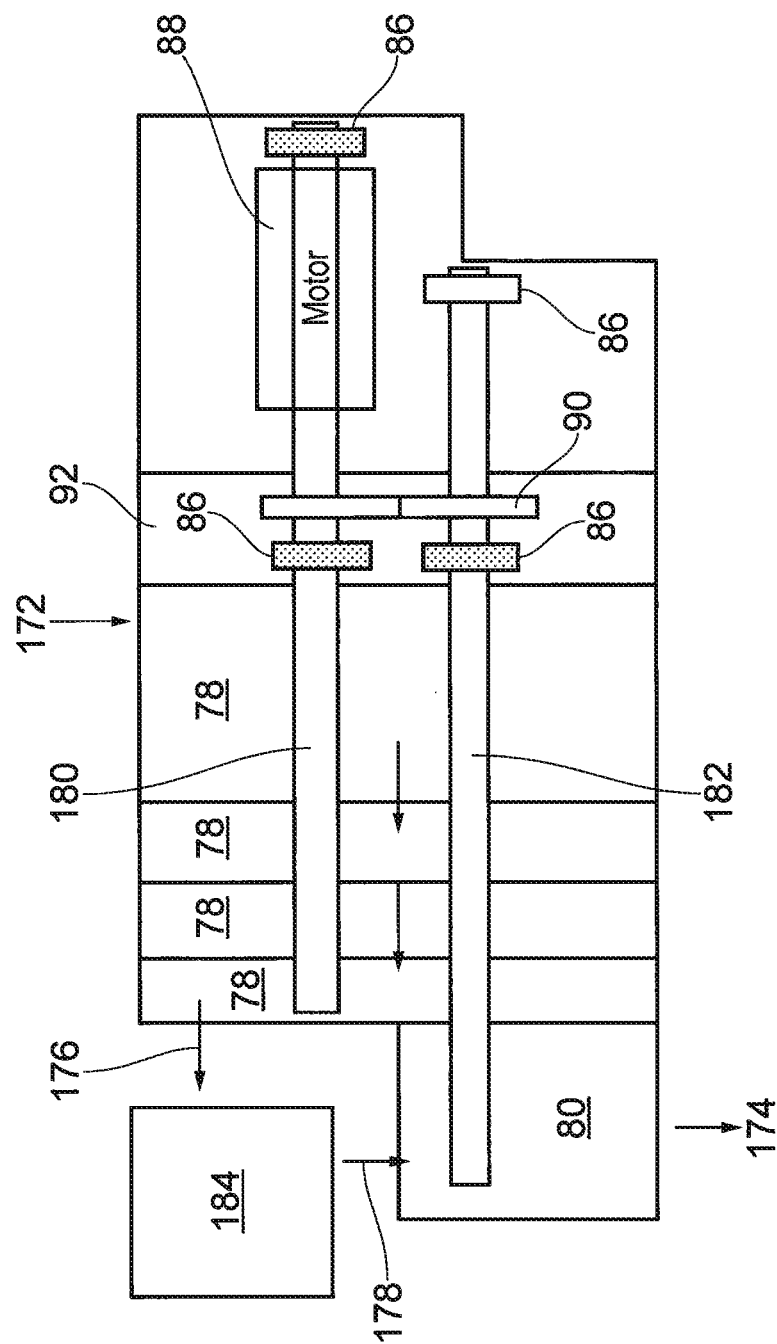
FIG. 11 illustrates a further combination dry and liquid ring pump according to one embodiment.

In FIG. 11, intermediate outlet and inlet ports 176, 178 are included between high vacuum pump stages 78 (roots and/or claw stages) and liquid ring pumping stage 80, Outlet port 176 connects the downstream high vacuum pumping stage 78 to a sub-atmospheric abatement apparatus 184 and intermediate inlet port 178 connects the sub-atmospheric abatement apparatus to the liquid ring pumping stage 80. In this way, the inlet pressure of approximately 100 mbar may be used for sub-atmospheric abatement to reduce or remove the requirement for further abatement of gases exhausted from the pump. For example the destruction of perfluoroalkanes in either a combustion or plasma type abatement device could be achieved in the apparatus 184. Then, the hydrogen fluoride, or other halogenated by-products exhausted from the abatement device 184 can be removed from the gas stream by contact with the service liquid in the liquid ring pump stage 80.

Additionally, in FIG. 11, the drive shafts 180, 182 are cantilevered and supported for rotation by bearings 86. A single liquid ring pumping stage 80 is driven by drive shaft 182.

The processes used in the manufacture of semiconductor devices and solar devices typically consist of a number of deposition and etching steps to generate the required features on a substrate material. The tools used for deposition steps generally have periodic cleaning phases in which the process chamber used for deposition (for example by CVD) is filled with a "clean gas" such as $F_2$, $NF_3$, $SF_6$ and a plasma ignited to generate fluorine atoms and ions. It is these fluorine atoms and ions which clean the chamber surfaces of deposits. The chemicals used for deposition, often Silane or Silicon containing compounds are generally incompatible with the aforementioned "clean gases" in that they will often spontaneously ignite or explode upon mixing. Because of this incompatibility, safety measures are used to prevent the mixing of these chemicals in the tool exhaust stream and the abatement techniques used to remove these chemicals need to be able to destroy both the deposition and clean gases.

Figure 12:
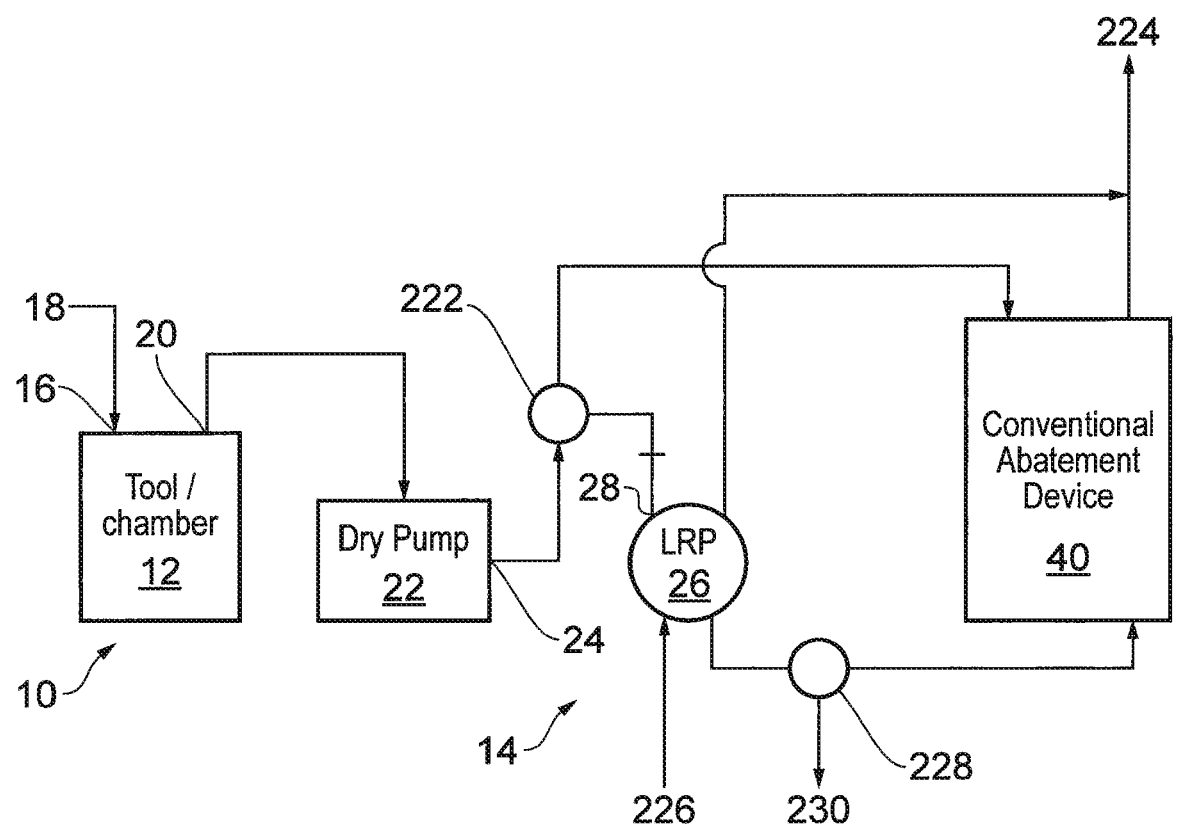
FIG. 12 illustrates schematically a further apparatus for selectively pumping a flammable effluent gas stream according to one embodiment.
Figure 13:
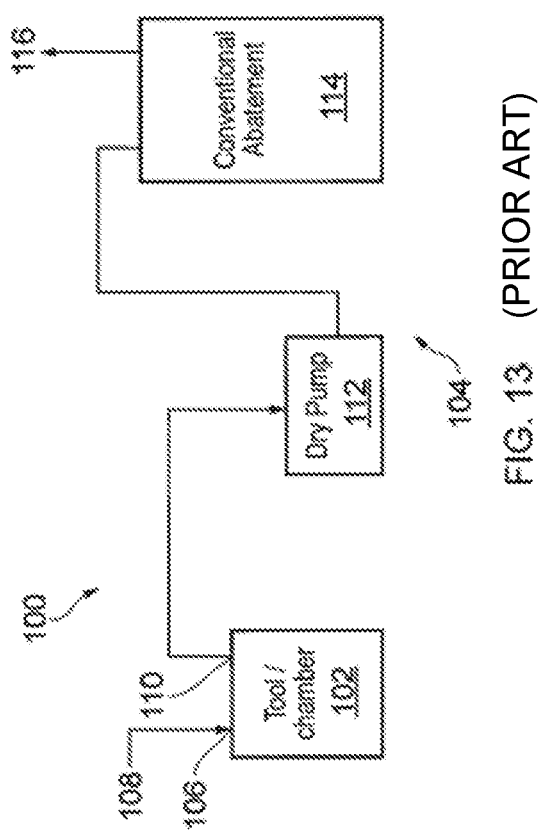
FIG. 13 illustrates schematically a prior art apparatus for pumping an effluent gas stream.

In the apparatus shown in FIG. 12, the apparatus is configured so that an exhaust gas stream can be selectively conveyed to a combustor of an abatement apparatus without passing through a liquid ring pumping mechanism during a first process step (which may be an etching step) and the exhaust gas stream is conveyed through the liquid ring pump to the combustor during a second process step (which may be a cleaning step). In more detail, a processing chamber 12 is pumped by dry pump 22 and exhausts gases through an exhaust 24. The exhaust 24 is connected to a 3-way valve 222 where the gas stream is either diverted, during the deposition step, to a combustor 40 for combusting Silane or Silicon containing compounds; or, during the cleaning step, to the LRP 26 for scrubbing Fluorine containing gases.

During a deposition step the combustor 40 treats the effluent gas stream by burning the waste gases. The treated gas stream then exits the combustor into a general factory/manufacturing facility duct 224. It is not efficient to continuously start and stop the LRP 26 between deposition steps. Therefore, during said deposition step, the LRP is still fed a continuous clean water stream 226, which it passes via a 3-way valve 228 into the combustor 40. Preferably, the liquid inlet of the abatement apparatus 40 conveys service liquid from the liquid ring pump 26 to an exhaust side of the abatement apparatus 40 where the gas stream exhausted from the abatement device has sufficient residual heat to evaporate the service liquid and thus remove heat from the gases exhausted from the abatement apparatus 40.

During the clean step, the effluent gas stream from the chamber 12 is directed by 3-way valve 222 to the LRP 26 where it is scrubbed/treated by the clean water. The acid waste stream is then directed into a containment vessel 230 by 3-way valve 228.

As shown, any gases exhausted from the LRP 26 during the clean step abatement process are conveyed to the facility duct 224. Alternatively, the gases exhausted from the LRP 26 may require combustion prior to disposal. Therefore, the LRP 26 may be connected in series with the combustor for abating effluent gas from the process tool after the cleaning gases have been removed/treated.

In FIG. 12 a separate wet scrubber unit (LRP 26) and combustor 40 are used to abate the clean and deposition gases respectively. When only a single abatement unit has been used to abate both clean and deposition gases from a process chamber the liquid waste volume is significantly greater than is achievable with separate, optimised abatement systems as described above. The combustion type devices of the embodiments will thus be less prone to attack by corrosive materials. The wet scrubber systems of the embodiments will not generating, or be required to withstand, the high temperatures of combustion, and are thus easily fabricated from corrosion resistant polymers and other materials and thus allow much higher concentrations of acid to be generated.

To enhance the reduction in liquid waste volume the residual heat from combustor exhaust evaporates the waste water stream from the wet scrubber when no clean gases are flowing. In this way, only acid and not clean water is pumped into the acid drain or containment facility, and therefore less volume of liquid requires containment or treatment.

The liquid ring pump 26 has been optimised with treatment of effluent corrosive gas streams in mind. In this regard, the liquid ring pump 26 of FIGS. 1 to 9 and 12 may also be adapted to be installed in a vertical orientation with the shaft extending generally vertically. It is noted that conventional liquid ring pumps have traditionally been horizontally mounted. Vertically mounting the pump allows the pump inlet 28 to be both parallel to the axis of rotation and vertical. Thus particle laden gas streams have an uninterrupted path into the pumping chamber 56, minimising the chances of blockage. Further opportunity for blockage is reduced by use of a specifically designed inlet system fed with service liquid ported directly, under pressure, from the liquid ring to flush the inlet path. For example as described for the weir arrangement in FIG. 5. Vertical mounting of the liquid ring pump also significantly reduces its footprint.

Figure 14:
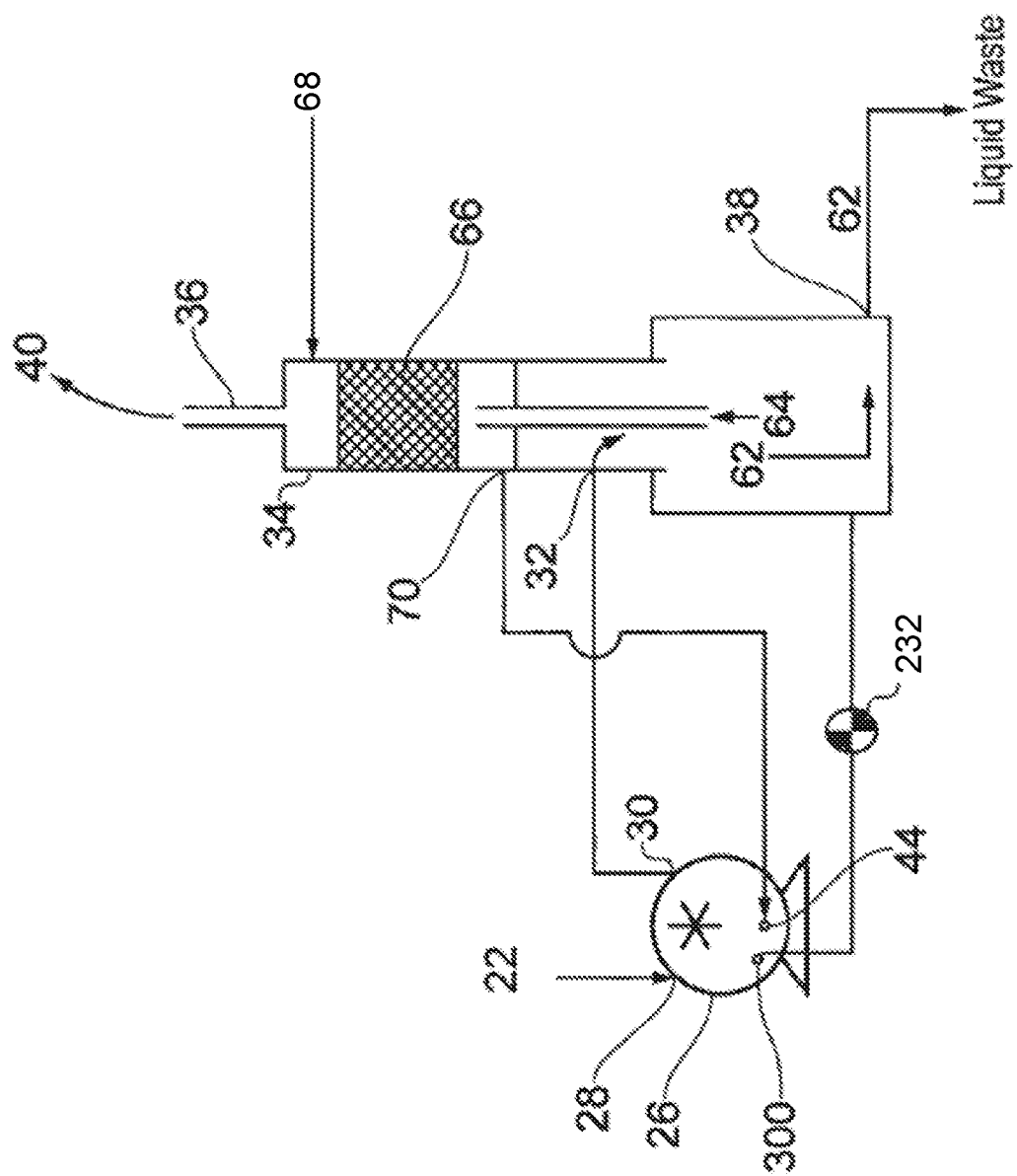
FIG. 14 illustrates schematically a further apparatus for rapidly stopping the liquid ring pump and preventing service liquid suck back according to one embodiment.

A further modification of the apparatus is shown in FIG. 14, with reference to FIG. 2. The LRP 26 has gas inlet and outlet ports 28, 30 and liquid inlet port. The LRP 26 further comprises a drain port 300 in liquid communication with the pumping chamber 56 so that service liquid can be drained from the pump thereby collapsing the liquid ring 48 (see FIG. 2) when a control valve 232 is opened. In order to retain gases within the system, the drain port 300 drains the liquid into the gas/liquid separator 34.

During a planned shutdown of the liquid ring pump 26, the liquid ring drain port 300 is opened and after approximately 5 to 15 seconds (depending upon the time required for the service liquid to drain and collapse the liquid ring) the power to the pump motor (not shown) is stopped. As the service liquid drains from the pump, and the liquid ring collapses, the pumping speed of the liquid ring pump steadily falls thereby decreasing the vacuum in the foreline upstream of inlet 28. Accordingly, when the pump motor of the liquid ring pump 26 is stopped service liquid from the pump is not sucked back along the foreline due to a pressure differential between the foreline and the now higher pressure pumping chamber 56.

The conductance of the drain port 300 and the conduit conveying liquid from the pump 26 to the separator 34 is selected so that the liquid drains from the pump sufficiently quickly so that the vacuum in the foreline can be broken relatively quickly and the pump can be stopped. As indicated above, the conductance is preferably selected to allow power to the motor to be cut about 5 to 15 seconds after the valve 232 is opened.

The arrangement shown in FIG. 14 has the additional benefit of draining the service liquid quickly from the pump thereby reducing any potential corrosion of the pump by corrosive products present in the service liquid.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. An apparatus for evacuating a gas stream comprising a corrosive fluid exhausted from a processing chamber, comprising:

a dry pumping arrangement for evacuating the gas stream comprising a corrosive fluid from the processing chamber;

a liquid ring pump arranged for evacuating the gas stream comprising a corrosive fluid from the dry pump and at least partially reducing the corrosive fluid content of the gas stream by dissolving said corrosive fluid into a service liquid of the liquid ring pump wherein the liquid ring pump comprises:

a housing;

a rotor in the housing;

a drive shaft, connected for driving the rotor for pumping gas in the housing, the drive shaft being in a substantially vertical orientation; and a gas inlet, parallel to the drive shaft and configured to receive gas conveyed in a substantially downward direction so that any particulates in the exhaust gas stream are conveyed in the direction of gravity into the liquid ring pump;

a separator for separating, from the service liquid and remaining gas stream mixture exhausted from the liquid ring pump, the remaining gas stream; and an abatement arrangement for treating the separated remaining gas stream exhausted from the separator.

2. The apparatus as claimed in claim 1, wherein the separator comprises a sump for collecting the service liquid exhausted with the remaining gas stream from the liquid ring pump, the sump being connected to a drain port for draining service liquid containing corrosive products to a waste disposal unit.

3. The apparatus as claimed in claim 1, wherein the separator further comprises a wet scrubber for scrubbing the remaining gas stream, separated from the service liquid in said separator, prior to its exhaust from the separator.

4. The apparatus as claimed in claim 3, wherein the wet scrubber comprises a liquid inlet port for conveying service liquid into the wet scrubber and a liquid outlet port for conveying service liquid from the wet scrubber to a liquid inlet of the liquid ring pump.

5. The apparatus as claimed in claim 4, wherein the service liquid inlet port of the wet scrubber is connected to a source of fresh service liquid, the liquid outlet port of the wet scrubber is connected to the service liquid inlet port of the liquid ring pump, and a service liquid outlet port of the liquid ring pump is connected to a waste disposal unit for disposing service liquid containing corrosive products.

6. The apparatus as claimed in claim 4, comprising a weir section upstream of the liquid ring pump through which service liquid can fall in contact with the gas stream conveyed from the exhaust of the dry pump to the liquid ring pump.

7. The apparatus as claimed in claim 6, wherein a liquid inlet of the weir section is connected to the liquid outlet of the wet scrubber so that service liquid can be conveyed from the wet scrubber for contact with gas in the weir section.

8. The apparatus as claimed in claim 6, wherein, in use, the liquid ring formed in the liquid ring pump has a pressure differential around the circumference of the liquid ring and the liquid ring pump comprises a liquid outlet, at a high enough pressure region of the liquid ring, connected to an inlet of the weir section so that service liquid is conveyed from the liquid ring pump to the weir for contact with gas in the weir section.

9. The apparatus as claimed in claim 1, comprising at least two liquid ring pumps arranged in series or parallel between the dry pump and the abatement arrangement.

10. The apparatus as claimed in claim 1, wherein the flow of service liquid into the liquid ring pump is used to control the temperature of the service liquid in the liquid ring pump.

11. The apparatus as claimed in claim 10, wherein the flow of service liquid into the liquid ring pump is restricted so that, in use, the temperature of the service liquid increases to at least a predetermined limit selected according to the constituents of the gas flow exhausted from the processing chamber.

12. The apparatus as claimed in claim 11, wherein flow of the service liquid into the liquid ring pump is restricted so that, in use, the temperature of the service liquid increases to at least 60° C. so that fluorine contained in the gas stream exhausted from the processing chamber does not generate substantial amounts of oxygen difluoride on contact with said service liquid.

13. The apparatus as claimed in claim 1, comprising a flame arrester located between the liquid ring pump and the separator for arresting the passage of flames from the liquid ring pump to the separator.

14. The apparatus as claimed in claim 13, wherein the flame arrester is shaped for containing a service liquid through which the remaining gas stream is constrained to pass when conveyed downstream of the liquid ring pump.

15. The apparatus as claimed in claim 14, wherein the flame arrester comprises a diffuser for increasing the surface area to volume ratio of bubbles of gas passing through the flame arrester thereby reducing the passage of flames downstream of the liquid ring pump.

16. The apparatus as claimed in claim 14, wherein the flame arrester comprises a liquid level sensor for sensing a liquid level therein and configured to generate a signal if the liquid level is below a predetermined level.

17. The apparatus as claimed in claim 14, comprising a liquid controller configured for controlling the acidity and/or temperature of liquid in the flame arrester by conveying liquid into the flame arrester from a source of fresh liquid to the flame arrestor and conveying heated liquid or liquid containing corrosive products away from the flame arrestor to a waste disposal unit.

18. The apparatus as claimed in claim 14, wherein the flame arrester has a liquid inlet arranged to receive service liquid from a liquid outlet from one of the liquid ring pump, the separator and/or a water weir upstream of the liquid ring pump.

19. The apparatus as claimed in claim 18, comprising a balance tube connected to allow liquid communication between a sump of the separator tank and the flame arrester so that liquid passes from the sump to the flame arrester to prevent the liquid level in the flame arrester from dropping below a predetermined level.

20. The apparatus as claimed in claim 1, wherein the dry pumping arrangement comprises at least one dry pumping stage having a rotor supported for rotation relative to a stator by a drive shaft, the liquid ring pump comprising a liquid ring pumping stage comprising a rotor supported for rotation in a stator by said drive shaft, an outlet of the at least dry pumping stage being connected to an inlet of the liquid ring pumping stage.

21. The apparatus as claimed in claim 20, wherein said at least one dry pumping stage comprises two co-operating rotors supported for rotation in a stator by respective drive shafts, the liquid ring pump comprising a first liquid ring pumping stage comprising a first rotor supported for rotation in a first stator by a first of said drive shafts and a second liquid ring pumping stage comprising a second rotor supported for rotation in a second stator by a second of said drive shafts, and wherein said at least one dry pumping stage comprises an outlet connected to an inlet of the liquid ring pump for pumping gas from said at least one dry pumping stage to the liquid ring pump.

22. The apparatus as claimed in claim 21, wherein the first liquid ring pumping stage comprises an inlet connected to an outlet of said at least one dry pumping stage and an outlet connected to an inlet of the second liquid ring pumping stage for pumping gas in series through said at least one dry pumping stage, the first liquid ring pumping stage and the second liquid ring pumping stage.

23. The apparatus as claimed in claim 21, wherein the outlet of said at least one dry pumping stage is connected to respective inlets of the first and the second liquid ring pumping stages so that gas can be pumped from said at least one dry pumping stage to the first and the second liquid ring pumping stages in parallel.

24. The apparatus as claimed in claim 20, comprising a pump housing which houses said at least one dry pumping stage and the liquid ring pump.

25. The apparatus as claimed in claim 20, wherein an outlet of said at least one dry pumping stage is connected to an inlet of a sub-atmospheric abatement apparatus and an outlet of the sub-atmospheric abatement apparatus is connected to an inlet of the liquid ring pump so that gas can be pumped first through said at least one dry pumping stage followed by treatment in the sub-atmospheric abatement apparatus and then pumped by the liquid ring pump.

26. The apparatus as claimed in claim 1, configured so that an exhaust gas stream can be selectively conveyed from the dry pumping arrangement to a combustor of an abatement apparatus without passing through the liquid ring pump when an exhaust gas stream is exhausted from the processing chamber during a first step and the exhaust gas stream is conveyed through the liquid ring pump to the combustor when an exhaust gas stream is exhausted from the processing chamber during a second processing step.

27. The apparatus as claimed in claim 26, wherein the first step is a deposition processing step and the second step is a processing chamber cleaning processing step.

28. The apparatus as claimed in claim 27, wherein the exhaust gas stream from the processing chamber during the deposition step comprises silicon or silane.

29. The apparatus as claimed in claim 27, wherein the exhaust gas stream from the processing chamber during the processing chamber cleaning step comprises fluorine atoms or ions.

30. The apparatus as claimed in claim 26, comprising a first valve connected to an outlet of the dry pumping arrangement, and respective inlets of the abatement arrangement and the liquid ring pump for selectively conveying gas from the dry pumping arrangement to either the abatement arrangement or the liquid ring pump.

31. The apparatus as claimed in claim 26, comprising a second valve connected to a liquid outlet of the liquid ring pump, a liquid inlet of the abatement arrangement and an acid waste disposal unit for selectively conveying service liquid from the liquid ring pump to either the abatement arrangement or the acid waste disposal unit.

32. The apparatus as claimed in claim 31, wherein the liquid inlet of the abatement apparatus is located to convey service liquid from the liquid ring pump to a location at the exhaust side of the abatement arrangement which has sufficient residual heat to evaporate the service liquid.

33. The apparatus as claimed in claim 1, wherein the liquid ring pump comprises a drain port in communication with a pumping chamber of the liquid ring pump; a valve being operable to allow the flow of service liquid from the pumping chamber for collapsing the liquid ring generated in the pumping chamber of the liquid ring pump during use, and wherein collapsing the liquid ring decreases the pumping speed of the pump thereby increasing the pressure in a foreline upstream of the pump.

34. The apparatus as claimed in claim 33, wherein the valve is located in a conduit connecting the pumping chamber of the liquid ring pump to the separator tank so that when the valve is opened service liquid drains from the liquid ring pump into the separator so that any corrosive gases conveyed with the service liquid from the pump can be separated from the service liquid for treatment.

* * * * *